United States Patent
Awano et al.

(10) Patent No.: US 7,633,148 B2
(45) Date of Patent: Dec. 15, 2009

(54) SEMICONDUCTOR DEVICE WITH SEMICONDUCTOR CHIPS MOUNTED ON MOUNTING BOARD VIA CONDUCTIVE ANAOTUBES

(75) Inventors: Yuji Awano, Kawasaki (JP); Masataka Mizukoshi, Kawasaki (JP); Taisuke Iwai, Kawasaki (JP); Tomoji Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/706,347

(22) Filed: Feb. 15, 2007

(65) Prior Publication Data

US 2007/0267735 A1   Nov. 22, 2007

(30) Foreign Application Priority Data

May 22, 2006   (JP)   ............................. 2006-141504

(51) Int. Cl.
*H01L 23/04* (2006.01)
*H01L 23/48* (2006.01)
*H01L 23/52* (2006.01)
*H01L 29/40* (2006.01)
*H01L 23/58* (2006.01)

(52) U.S. Cl. ................... 257/698; 257/690; 257/692; 257/734; 257/741; 257/773; 257/775; 257/754; 257/786; 257/798; 977/720; 977/721; 977/722; 977/762; 977/763; 977/766; 977/784; 977/932; 977/936; 977/937; 977/938; 977/963

(58) Field of Classification Search ............. 257/690, 257/692, 698, 734, 741, 773, 775, 784, 786, 257/798; 977/720–722, 762–763, 766, 784, 977/932, 936–938, 963

See application file for complete search history.

(56) References Cited

U.S. PATENT DOCUMENTS

| | | | | |
|---|---|---|---|---|
| 6,819,001 | B2* | 11/2004 | Burdick et al. | 257/778 |
| 6,995,416 | B2* | 2/2006 | Reisinger et al. | 257/296 |
| 7,268,423 | B2* | 9/2007 | Beer et al. | 257/698 |
| 7,301,779 | B2* | 11/2007 | Honlein et al. | 361/772 |
| 7,371,674 | B2* | 5/2008 | Suh et al. | 438/612 |
| 7,385,343 | B2* | 6/2008 | Hirasawa et al. | 313/495 |
| 7,393,175 | B2* | 7/2008 | Petrin | 414/749.1 |
| 7,402,909 | B2* | 7/2008 | Suh et al. | 257/753 |
| 7,453,154 | B2* | 11/2008 | Teo et al. | 257/777 |

(Continued)

FOREIGN PATENT DOCUMENTS

JP   2004-528727   9/2004

OTHER PUBLICATIONS

M. Nihei, et al.; "Direct Diameter-Controlled Growth of Multiwall Carbon Nanotubes on Nickel-Silicide Layer;" *Jpn. J. Appl. Phys.*; vol. 42 Part 2; No. 6B; Jun. 15, 2003; pp. L 721-L 723 (2 Sheets.)/ Discussed in the specification.

*Primary Examiner*—Ida M Soward
(74) *Attorney, Agent, or Firm*—Fujitsu Patent Center

(57) ABSTRACT

A plurality of conductive pads (2) are formed on a mounting surface of a mounting board. Conductive pads (11) are formed on a principal surface of a semiconductor chip (10) at positions corresponding to the conductive pads of the mounting board, when the principal surface faces toward the mounting board. A plurality of conductive nanotubes (12) extend from the conductive pads of one of the mounting board and the semiconductor chip. A press mechanism (3) presses the semiconductor chip against the mounting board and restricts a position of the semiconductor chip on the mounting surface to mount the semiconductor chip on the mounting board, in a state that tips of the conductive nanotubes are in contact with the corresponding conductive pads not formed with the conductive nanotubes.

10 Claims, 10 Drawing Sheets

U.S. PATENT DOCUMENTS

| | | | |
|---|---|---|---|
| 2006/0071334 A1* | 4/2006 | Kawabata et al. | 257/741 |
| 2006/0113656 A1* | 6/2006 | Uang et al. | 257/690 |
| 2006/0180941 A1* | 8/2006 | Kirby et al. | 257/774 |
| 2006/0243480 A1* | 11/2006 | Kasahara et al. | 174/260 |
| 2008/0224301 A1* | 9/2008 | Bauer et al. | 257/698 |
| 2008/0308953 A1* | 12/2008 | Autumn et al. | 257/783 |

* cited by examiner

SEMICONDUCTOR DEVICE WITH SEMICONDUCTOR CHIPS MOUNTED ON MOUNTING BOARD VIA CONDUCTIVE ANAOTUBES

CROSS REFERENCE TO RELATED APPLICATION

This application is based on and claims priority of Japanese Patent Application No. 2006-141504 filed on May 22, 2006, the entire contents of which are incorporated herein by reference.

BACKGROUND OF THE INVENTION

A) Field of the Invention

The present invention relates to a semiconductor device with semiconductor chips mounted on a mounting board.

B) Description of the Related Art

Conventionally, when a semiconductor chip is mounted on a mounting board, conductive pads on the mounting board and conductive pads on a semiconductor chip are mechanically and electrically bonded by metal bumps made of metal such as solder.

As the integration degree of a semiconductor chip improves and miniaturization of conductive pads improves, a density of current flowing through metal bumps increases. Therefore, metal atoms constituting the metal bump are likely to move due to electromigration. Movement of metal atoms cause breakdown (conduction defects) of bumps. For example, if solder bumps are used, Sn of the bump material is likely to move. As Sn moves, a region where a Sn density is lowered is formed, and breakdown is likely occur in this lowered density region.

While bonding is performed by melting solder, the semiconductor chip and mounting board are heated to a high temperature. As the semiconductor chip and mounting board lower their temperatures to a room temperature after bonding, stress is generated because of a difference between thermal expansion coefficients of the semiconductor chip and the mounting board. A thermal expansion coefficient of the mounting board is generally equal to or more than ten times that of the semiconductor chip. As the semiconductor chip and mounting board lower their temperatures to the room temperature, the mounting board shrinks more greatly. A compression stress is therefore applied to the semiconductor chip in an in-plane direction. As the stress is generated, a mechanically weakest region is broken. For example, metal bumps, low dielectric insulating materials of the semiconductor chip are broken. Stress of this type is also generated by a temperature change during device operation after mounting.

Japanese Patent National Publication No. 2004-528727 discloses techniques of bonding together conductive pads of a mounting board and a semiconductor chip by using carbon nanotubes. Description will be made on a bonding method disclosed in Japanese Patent National Publication No. 2004-528727.

Carbon nanotubes grow from the conductive pads of a semiconductor chip by plasma enhanced chemical vapor deposition (PECVD). Roots of the carbon nanotubes are buried (placed) in the conductive pads of the semiconductor chip, and tips thereof are buried in conductive pads of a mounting board. Namely, opposite ends of the carbon nanotubes are soldered to the conductive pads of the semiconductor chip and mounting board. In this manner, the semiconductor chip is mechanically and electrically bonded to the mounting board via the carbon nanotubes.

It is known that a density of current allowed to flow in one carbon nanotube is higher by two to three digits than that of conventional metal. Breakdown by electromigration is therefore hard to occur.

Since carbon nanotubes are flexible, a mounted semiconductor chip can move slightly in the in-plane direction relative to the mounting board. Destruction can therefore be prevented which is otherwise caused by a difference between thermal expansion coefficients.

SUMMARY OF THE INVENTION

If an operation defect of some chips among a plurality of semiconductor chips mounted on one mounting board is detected during inspection after mounting, it is necessary to replace (repair) those semiconductor chips with detected defects. For example, even if a non-defective product rate of semiconductor chips is 99%, a non-defective product rate of a semiconductor device made of thirteen semiconductor chips mounted on one mounting board lowers to 88%. However, it is difficult to dismount a semiconductor chip once mounted by a metal bump bonding method or the carbon nanotube bonding method described in Japanese Patent National Publication No. 2004-528727.

An object of the present invention is to provide a semiconductor device capable of easily dismounting semiconductor chips once mounted on a mounting board.

According to one aspect of the present invention, there is provided a semiconductor device comprising:

a mounting board having a plurality of conductive pads on a mounting surface;

at least one semiconductor chip having conductive pads formed at positions corresponding to the conductive pads on the mounting board, when a principal surface of the semiconductor chip facing toward the mounting board;

a plurality of conductive nanotubes extending from the conductive pads of one of the mounting board and the semiconductor chip; and a press mechanism for pressing the semiconductor chip against the mounting board to mount the semiconductor chip on the mounting board by restricting a position of the semiconductor chip in the mounting surface, in a state that tips of the conductive nanotubes are in contact with the corresponding conductive pad not formed with conductive nanotubes.

According to another aspect of the present invention, there is provided a semiconductor device comprising:

a mounting board having a plurality of conductive pads on a mounting surface;

at least one semiconductor chip having a conductive pad formed at positions corresponding to the conductive pads of the mounting board, when a principal surface of the semiconductor chip faces toward the mounting board;

a plurality of conductive nanotubes extending from the conductive pads of one of the mounting board and the semiconductor chip; and adhesive made of material softer than any of the mounting board and the semiconductor chip, the adhesive being impregnated at least in a partial space between the mounting board and the semiconductor chip and holding the semiconductor chip above the mounting board, in a state that tips of the conductive nanotubes are in contact with the corresponding conductive pads not formed with conductive nanotubes.

According to still another aspect of the present invention, there is provided a semiconductor device comprising:

a mounting board having a plurality of conductive pads on a mounting surface;

a semiconductor chip having conductive pads formed at positions corresponding to the conductive pads of the mounting board, when a principal surface of the semiconductor chip faces toward the mounting board; and a plurality of conductive nanotubes extending from the conductive pads on both of the mounting board and the semiconductor chip, wherein the semiconductor chip is mounted on the mounting board such that sidewalls of the plurality of conductive nanotubes extending from the conductive pads of the mounting board are in contact with sidewalls of the plurality of conductive nanotubes extending from the conductive pads of the semiconductor chip.

If conductive nanotubes are formed on conductive pads of both a mounting board and a semiconductor chip, electric contact can be retained at sidewalls of adjacent conductive nanotubes. It is therefore possible to detachably mount a semiconductor chip on a mounting board.

DESCRIPTION OF THE PREFERRED EMBODIMENTS

A semiconductor device of the first embodiment will be described with reference to FIGS. 1A to 1C.

Figure 1A:
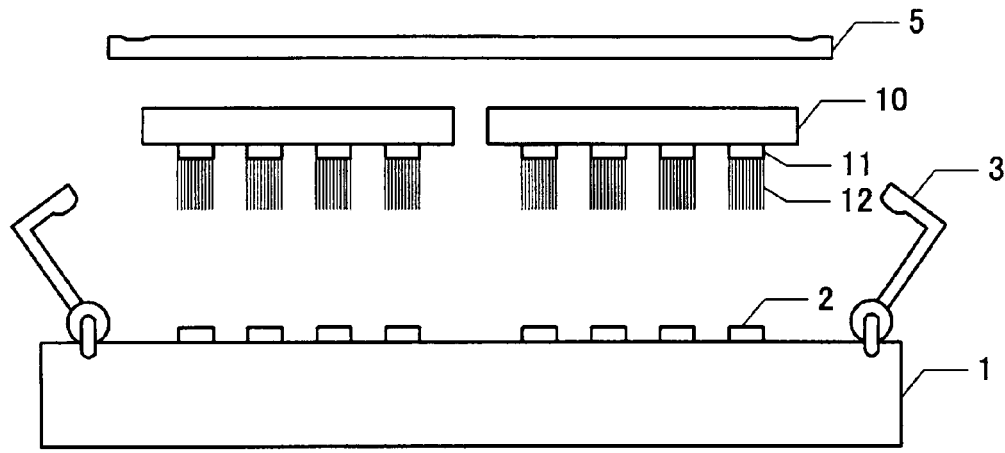
FIGS. 1A to 1C are schematic diagrams showing a semiconductor device of a first embodiment.
Figure 1B:
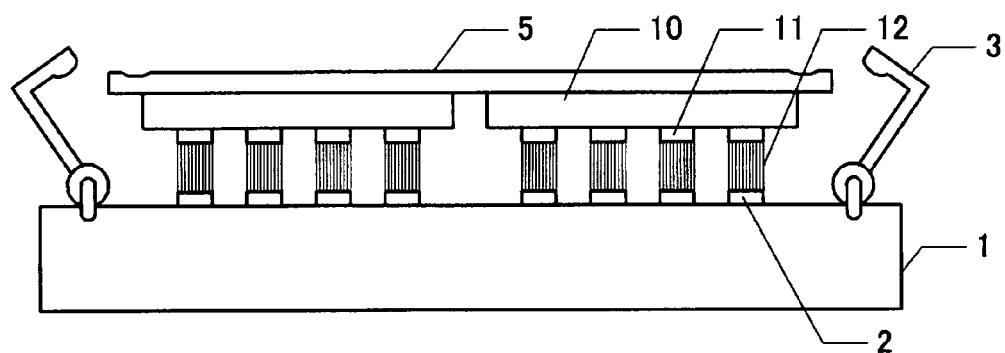

As shown in FIG. 1A, the semiconductor device of the first embodiment includes a mounting board 1, a plurality of semiconductor chips 10, a press mechanism 3 and a heat spreader 5.

A plurality of conductive pads 2 are formed on a mounting surface of the mounting board 1. For example, the mounting board 1 is a printed-circuit board having a plurality of wiring layers formed on the board.

A plurality of semiconductor chips 10 are mounted on the mounting board 1. Each semiconductor chip 10 includes a plurality of conductive pads 11 formed on a principal surface thereof. The conductive pads 11 of the semiconductor chip 10 are disposed at positions corresponding to the corresponding conductive pads 2 of the mounting board 1, when the principal surface of the semiconductor chip 10 faces the mounting board 1. A number of conductive nanotubes 12 extend from the conductive pads 11 in a direction generally perpendicular to the principal surface of the semiconductor chip 10. The conductive nanotube 12 may be a carbon nanotube.

The press mechanism 3 is mounted on the mounting surface of the mounting board 1. For example, the press mechanism 3 includes hooking pins whose base portions are pivotally mounted on the mounting board 1.

Figure 2A:
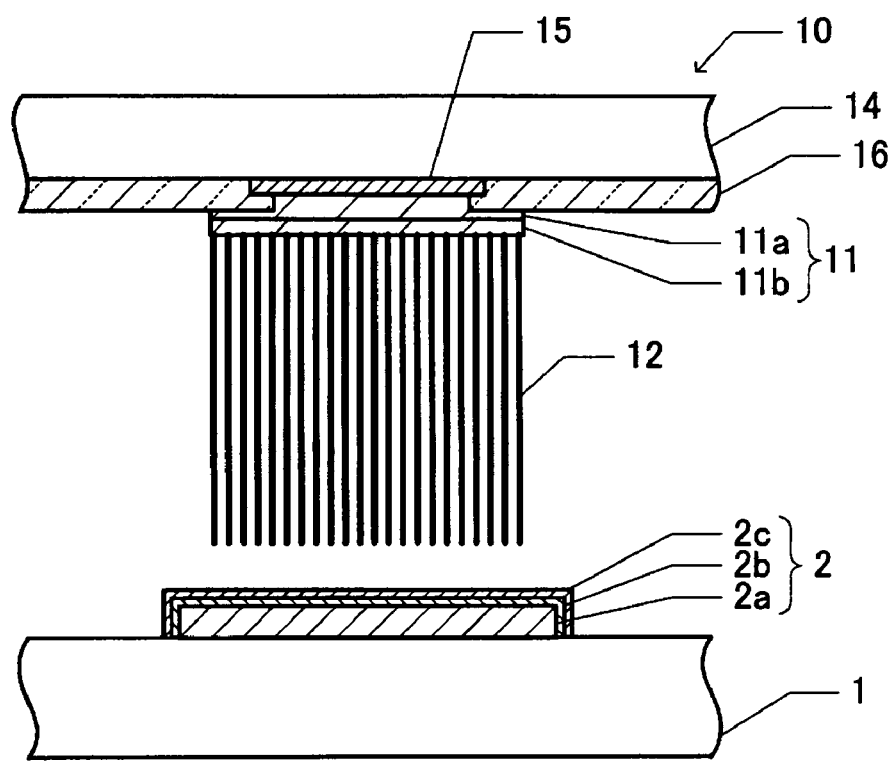
FIG. 2A and 2B are schematic diagrams showing a connection portion between a mounting board and a semiconductor chip of the semiconductor device of the first embodiment.

FIG. 2A is a cross sectional view showing a main portion of the semiconductor device. The conductive pad 2 formed on the mounting board 1 has a lamination structure that, for example, the surface of a thin film pattern 2a made of Cu is covered with an Ni film 2b, and the surface of the Ni film is covered with an Au film 2c. A plan shape of the conductive pad 2 is, for example, a square or rectangle.

The semiconductor chip 10 includes, for example, a substrate 14 having a number of transistors, multi-layer wirings and the like formed on the surface of the substrate, an Al pad 15 formed on the uppermost layer of the substrate, and a protective film 16 covering the surfaces of the substrate 14 and pad 15. An opening is formed thorough the protective film 16 to expose a part of the surface of the pad 15. The conductive pad 11 is connected to a lower layer pad 15 via the opening. The conductive pad 11 has a lamination structure that, for example, a Ti film 11a and a Ni film 11b are laminated in this order.

As shown in FIG. 1 B, when the semiconductor chips 10 are mounted on the mounting board 1, tips of the conductive nanotubes 12 are made in contact with the corresponding pads 2 on the mounting board 1. Further, the heat spreader 5 is made in contact with the back surface of the semiconductor chips 10.

Figure 1C:
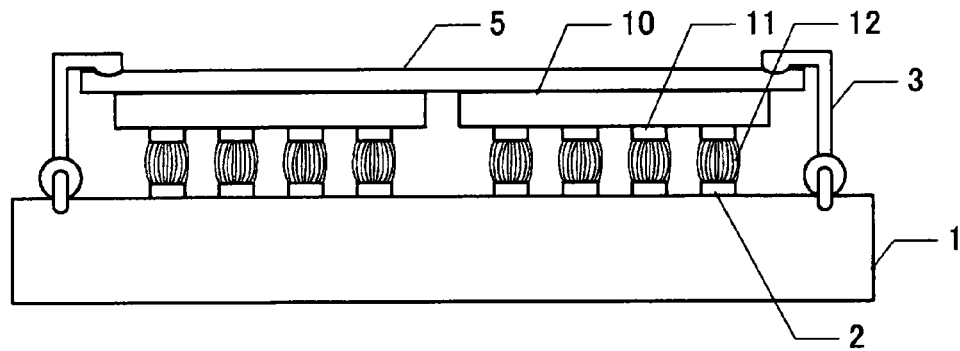

As shown in FIG. 1C, a force for pressing the heat spreader 5 toward the mounting board 1 is applied to the heat spreader 5 to press the semiconductor chips 10 against the mounting board 1.

Figure 2B:
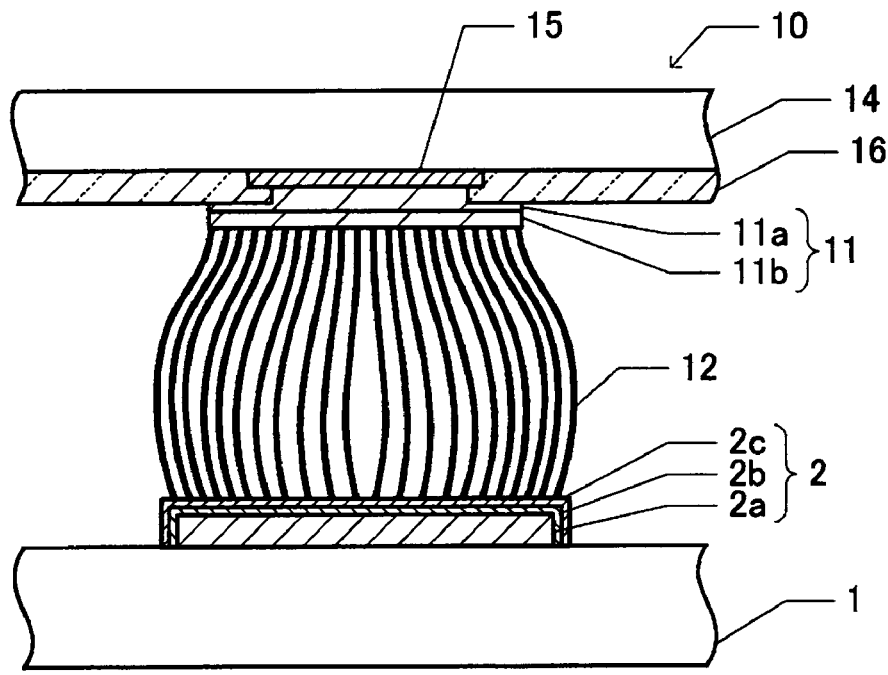

FIG. 2B is a schematic diagram showing the shapes of conductive nanotubes 12 in the state that the semiconductor chips 10 are pressed against the mounting board 1. Since the conductive nanotubes 12 such as carbon nanotubes have elasticity, as the semiconductor chips 10 are pressed against the mounting board 1, the conductive nanotubes 12 are subjected to elastic deformation. By a restoring force of the conductive nanotubes 12, the tips thereof are enforced to the conductive pads 2 of the mounting board 1.

Description continues reverting to FIG. 1C. Tops of the hooking pins of the press mechanism 3 are engaged with recesses formed in edge portions of the heat spreader 5. It is therefore possible to maintain the state that the semiconductor chips 10 are pressed against the mounting board 1. The positions of the semiconductor chips 10 relative to the mounting surface are restricted by a friction force between the semiconductor chips 10 and heat spreader 5 and a friction force between the tips of the conductive nanotubes 12 and the conductive pads 2 on the mounting substrate 1.

In the first embodiment described above, the conductive pads 2 of the mounting board 1 and the conductive pads 11 of the semiconductor chips 10 are electrically connected by the conductive nanotubes 12. Consider now that carbon nanotubes are used as the conductive nanotubes 12. Since carbon nanotubes 12 are structured by strong $sp^2$ coupling, electromigration is hard to occur.

The conductive pads 2 on the mounting board 1 and the conductive pads 11 on the semiconductor chips 10 are electrically connected by elastic deformation of the conductive nanotubes 12. A plurality of conductive nanotubes 12 are coupled weak mutually by a van der Waals force. Therefore, as one of the mounting board 1 and the semiconductor chip 10 expands or contracts relative to the other caused by a difference between thermal expansion coefficients of the mounting board 1 and semiconductor chip 10, the conductive nanotubes 12 elastically deform easily.

Since stress generated by relative deformation of the mounting board 1 and semiconductor chip 10 is absorbed by elastic deformation of the conductive nanotubes 12, stress applied to the mounting board 1 and semiconductor chip 10 is reduced. It is therefore possible to prevent destruction of the connection portion between the conductive pads 2 and 11, the semiconductor chips 10 and the like.

Since the conductive nanotubes 12 elastically deform, it is not necessary to make flush the heights of the conductive pads 2 on the mounting board 1 and the conductive pads 11 on the semiconductor chip 11. A difference between heights of the conductive pads 2 and 11 can be absorbed sufficiently by the conductive nanotubes 12.

In the inspection after a plurality of semiconductor chips 10 are mounted on a single mounting board 1, if it is detected that some semiconductor chips 10 are defective, the press mechanism 3 is released from the heat spreader 5 so that only the semiconductor chips 10 detected as defective can be dismounted easily from the mounting board 1. Namely, the semiconductor chips 10 are mounted removably on the mounting board 1. It is therefore possible to mount new semiconductor chips 10 as the substitutes for the defective semiconductor chips 10.

The conductive nanotubes 12 contact the conductive pad 2 on the mounting board 1 simply by a restoring force of the conductive nanotubes 12. Therefore, the mounting board 1 is not damaged at all while the semiconductor chips 10 are dismounted. After the defective semiconductor chips 10 are dismounted, the mounting board 1 is not required to be subject to repair or the like.

Next, with reference to FIGS. 3A and 3B, description will be made on an example of a method of forming carbon nanotubes.

Figure 3A:
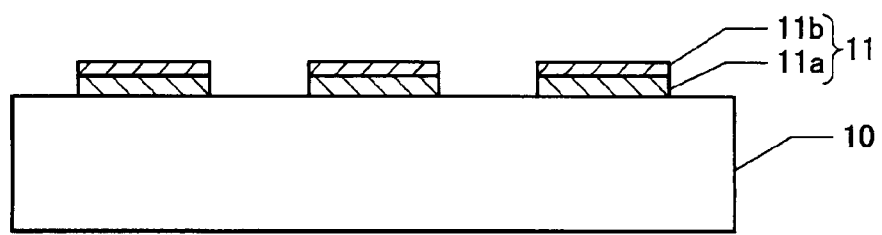
FIGS. 3A and 3B are schematic diagrams of a semiconductor chip illustrating a carbon nanotube growth method.

As shown in FIG. 3A, conductive pads 11 are formed on a principal surface of a semiconductor chip 10. The conductive pad 11 has a two-layer structure of a lower Ti film 11a and an upper Ni film 11b. The Ni film 11b functions as catalyst during growth of carbon nanotubes.

Figure 3B:
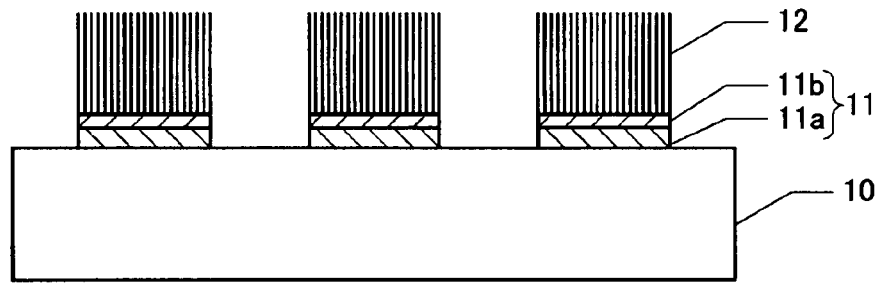

As shown in FIG. 3B, carbon nanotubes 12 grow on the Ni film 11b by chemical vapor deposition (CVD). As source gas, hydrocarbon based gas such as acetylene and methane, and alcohol based material such as ethanol and methanol may be used. A growth temperature is set to 400° C. to 700° C. Even if the growth temperature is lowered to 300° C., carbon nanotubes can grow.

As disclosed, for example, in a known document JJAP vol. 42 (2003), pp. L721 to L723, Part 2, No. 6B, 15 Jun. 2003, orientation growth of multi-layer carbon nanotubes having a plurality of carbon atom layers laminated radially can be achieved by various CVDs such as thermal CVD, thermal filament CVD and plasma CVD.

In order to orient carbon nanotubes perpendicular to the substrate surface, carbon nanotubes grow in a state that an electric field is applied in a direction perpendicular to the substrate surface. The carbon nanotubes 12 grow being oriented in a direction parallel to the applied electric field. Therefore, grown carbon nanotubes are oriented perpendicular to the substrate surface. Alternatively, carbon nanotubes may grow under the density condition of $1\times10^{11}$ tubes per 1 $cm^2$. In this case, carbon nanotubes grow being oriented along a direction perpendicular to the substrate surface, without being dispersed in different directions (without being separated one carbon nanotube after another) by a mutual van der Waals force of the carbon nanotubes, Although the Ni film 11b is used as catalyst in the example shown in FIGS. 3A and 3B, other materials may also be used as catalyst. For example, instead of the Ni film 11b, a film made of catalyst containing transition metal such as cobalt (Co) and iron (Fe) may be used. Catalyst may be used as a thin film or fine particles. Catalyst may be contained in a supporting member such as zeolite, or self-organizing sequence of protein such as ferritin containing a catalyst metal element may be utilized.

In the example shown in FIGS. 3A and 3B, the carbon nanotubes 12 grow on catalyst, and catalyst is not left at the tips of the carbon nanotubes. However, depending upon the growth condition, fine particles of metal catalyst are left at the tips of the carbon nanotubes 12.

Figure 4:
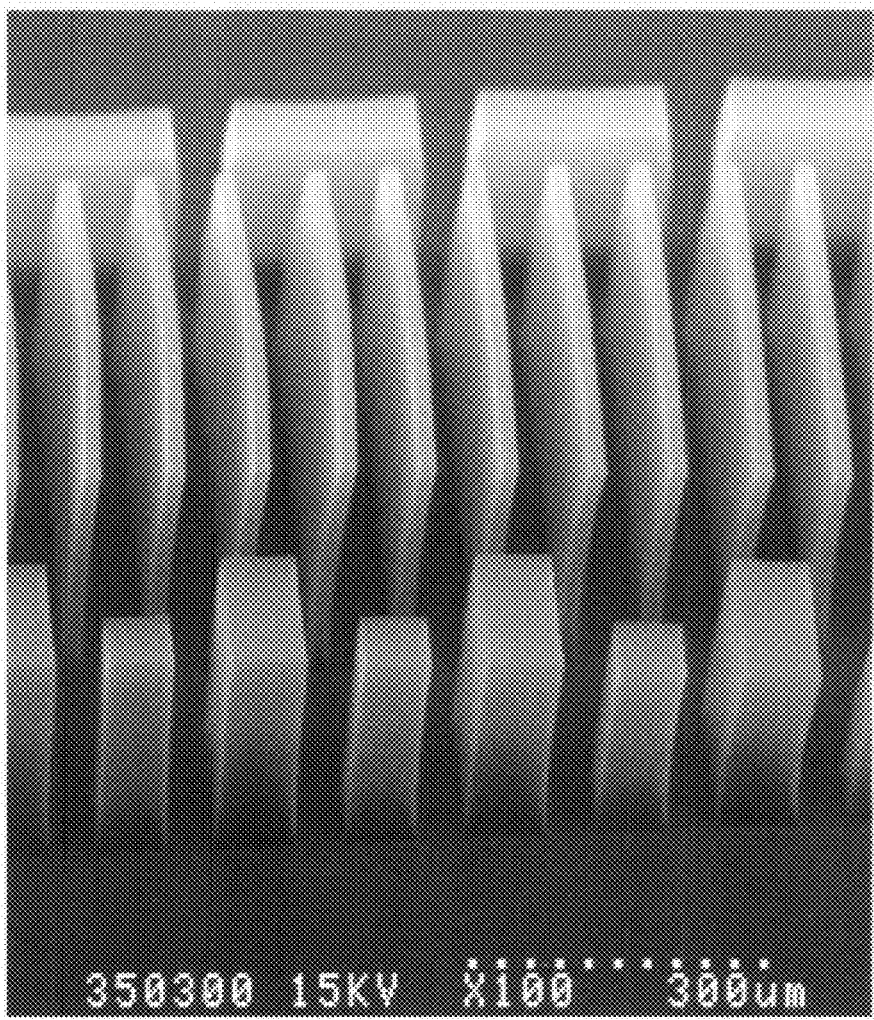
FIG. 4 is an SEM photograph showing grown carbon nanotubes.

FIG. 4 shows an SEM photograph of carbon nanotubes actually formed by CVD. An AlN substrate was used as a growth substrate, a patterned iron film was used as catalyst, and a growth temperature was set to about 500° C. It can be seen that carbon nanotubes grow along a direction generally perpendicular to the substrate surface.

Next, a semiconductor device of the second embodiment will be described with reference to FIGS. 5A to 5C.

Figure 5A:
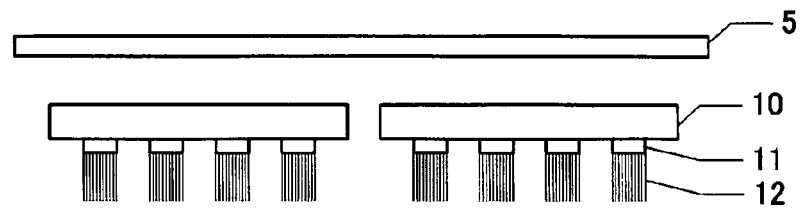
FIG. 5A and 5B are schematic diagrams showing a semiconductor device of a second embodiment during manufacture.

As shown in FIG. 5A, a plurality of conductive pads 2 are formed on a mounting surface of a mounting board 1. Conductive pads 11 are formed on the surface of each semiconductor chip 10 to be mounted on the mounting board 1, and roots of a plurality of conductive nanotubes 12 are fixed on the surface of each pad 11. These structures are the same as those of the semiconductor device of the first embodiment shown in FIG. 1A. In the second embodiment, the press mechanism 3 shown in FIG. 1A is not mounted on the mounting board 1.

Figure 5B:
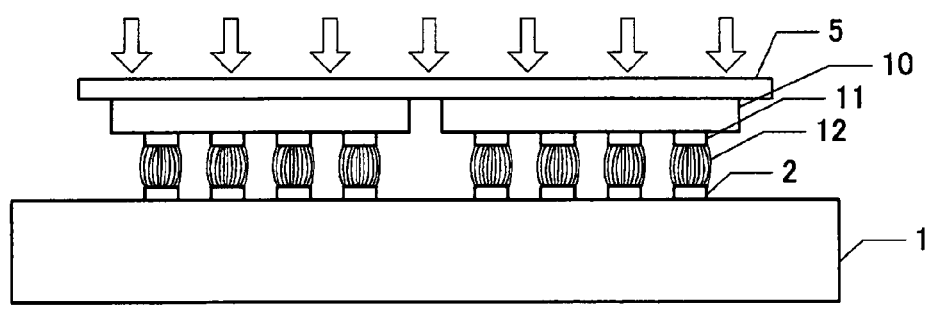

As shown in FIG. 5B, tips of the conductive nanotubes 12 are made in contact with the corresponding pads 2 on the mounting board 1. A heat spreader 5 is made in contact with the back surface of the semiconductor chips 10. A force for pressing the heat spreader 5 toward the mounting board 1 is applied to the heat spreader 5 to press the semiconductor chips 10 against the mounting board 1. In this case, as in the case of the first embodiment, the conductive nanotubes 12 elastically deform so that the tips thereof are enforced to the conductive pads 2.

Figure 5C:
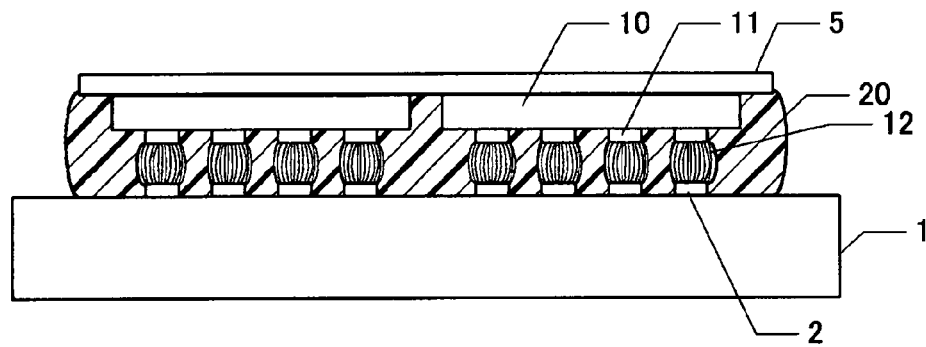
FIG. 5C is a schematic diagram showing the semiconductor device of the second embodiment.

As shown in FIG. 5C, in the state that the heat spreader 5 is pressed against the mounting board 1, adhesive 20 before curing is impregnated between the mounting board 1 and heat spreader 5. Impregnating the adhesive can be performed easily, for example, by utilizing the capillary phenomenon. Thereafter, the adhesive 20 is cured. As the adhesive 20, resin is used which is rich in flexibility (large elastic modulus) more than the mounting board 1 and semiconductor chips 10 even after curing.

In the second embodiment, the adhesive 20 maintains the state that the semiconductor chips 10 are enforced to the molding board 1. Tips of the conductive nanotubes 12 are in contact with the conductive pads 2 stably. Since the adhesive 20 is rich in flexibility, it is possible to prevent a large stress from being applied to the mounting board 1 and semiconductor chips 10, because the adhesive 20 is distorted when the mounting board 1 and semiconductor chips 10 deform each other due to a difference between thermal expansion coefficients and the like.

The adhesive 20 is not impregnated in the region where conductive nanotubes 12 are gathered densely (region where the conductive pads 2 and 11 face each other), but impregnated in the other region, in the space between the mounting board 1 and heat spreader 5. Since the adhesive 20 is not impregnated in the region where the conductive nanotubes 12 are gathered densely, the restoring force of the conductive nanotubes 12 maintains the state that the tips of the conductive nanotubes 12 are enforced to the conductive pads 2 of the mounting board 1.

In the example shown in FIG. 5C, although the adhesive 20 is impregnated in the whole region other than the region where the conductive nanotubes 12 are gathered densely, the adhesive is not required to be impregnated in the whole region. The structure may be adopted in which the adhesive 20 is impregnated in the region only near the outer periphery of the semiconductor chips 10, or the structure may be adopted in which the adhesive 20 is impregnated in the region only near the outer periphery of the heat spreader 5. It is not necessary to impregnate the adhesive without any gap along the outer periphery of each semiconductor chip 10 or heat spreader 5. For example, adhesive may be impregnated discretely along the outer periphery.

Next, a semiconductor device of the third embodiment will be described with reference to FIGS. 6A to 6E. In the first embodiment, the carbon nanotubes 12 grow directly on the conductive pads 11 of the semiconductor chips 10 as described with reference to FIGS. 3A and 3B. If a substrate is used which has heat resistance not durable at a growth temperature of carbon nanotubes, carbon nanotubes cannot grow by the method described with reference to FIGS. 3A and 3B. There is a case that it is not preferable to expose the substrate to a high temperature because of the characteristics of the device. In the third embodiment described hereunder, carbon nanotubes can be formed without exposing the substrate to a high temperature while carbon nanotubes are formed on the substrate.

Figure 6A:
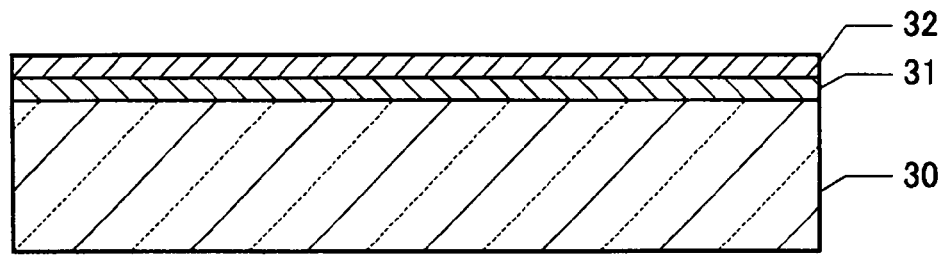
FIGS. 6A to 6E are cross sectional views of a semiconductor device of a third embodiment during manufacture.

As shown in FIG. 6A, a Ti film 31 is formed on the surface of a growth substrate 30 such as a quartz glass substrate and a silicon substrate having sufficient heat resistance, and a Ni film 32 is formed on the Ti film 31.

Figure 6B:
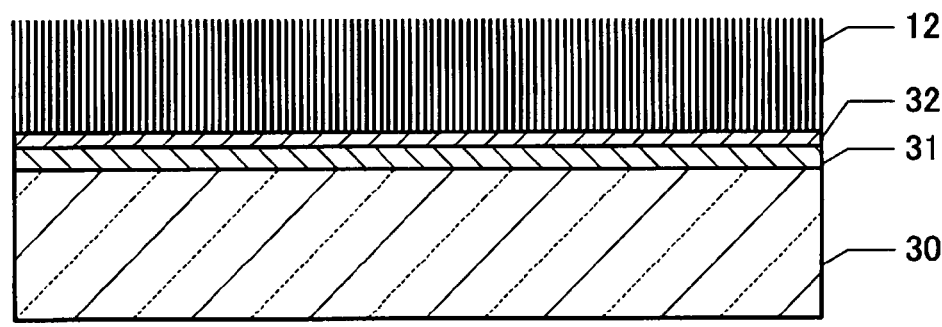

As shown in FIG. 6B, carbon nanotubes 12 grow on the surface of the Ni film 32 by CVD using source gas such as acetylene.

Figure 6C:
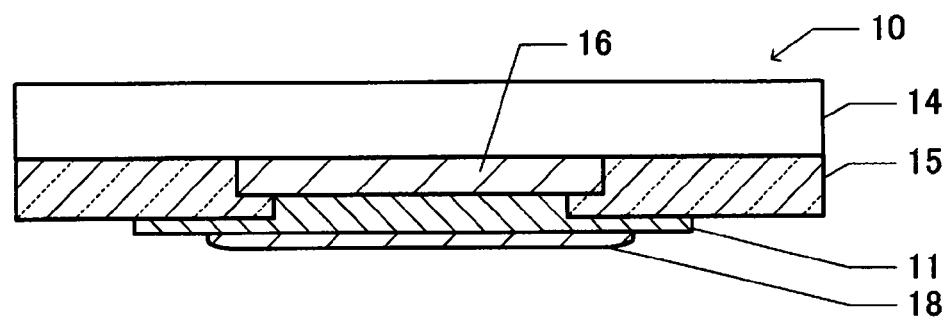

FIG. 6C is a cross sectional view of a semiconductor chip 10 to be mounted. A pad 16 of Al or the like is formed on the uppermost layer of a substrate 14 formed with semiconductor devices, multi-layer wirings and the like. A protective film 15 covers the substrate 14 and pad 16. An opening is formed through the protective film 15 to expose a partial surface of the pad 16. A conductive pad 11 is formed covering the pad 16 exposed on the bottom of the opening and the peripheral area of the opening of the protective film 15. For example, the conductive pad 11 has a three-layer structure of a Ti film of 0.3 μm in thickness, an Ni layer of 1 μm in thickness and an Au layer of 1 μm in thickness laminated in this order from the substrate 14 side.

Conductive paste 18 of AgPd or the like is coated in a partial surface area of the conductive pad 11. A thickness of the conductive paste 18 is, for example, 10 μm to 20 μm.

Figure 6D:
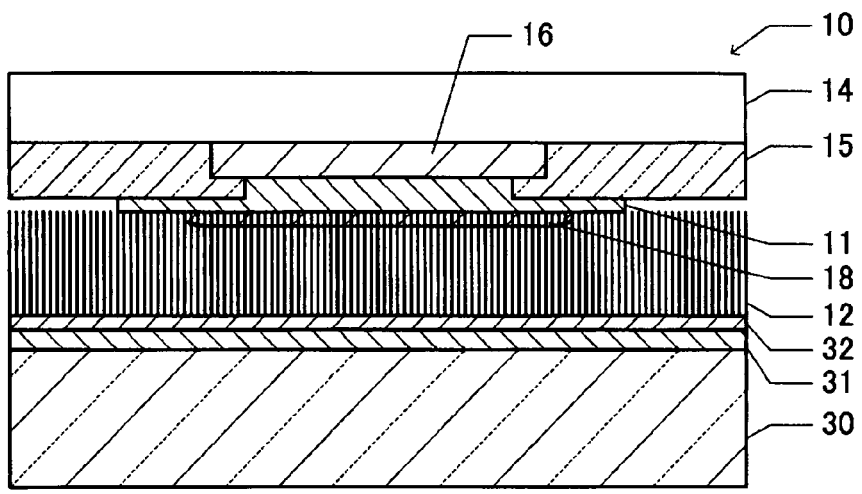

As shown in FIG. 6D, the surface of the substrate 30 on the side where the carbon nanotubes 12 are formed are faced toward the surface of the semiconductor chip 10 on the side where the conductive pad 11 is formed. The substrate 30 and semiconductor chip 10 are moved near to each other until tips of the carbon nanotubes 12 are buried (placed) in the conductive paste 18. In this state, the conductive paste 18 is sintered so that the carbon nanotubes 12 are firmly fixed to the conductive pad 11.

Figure 6E:
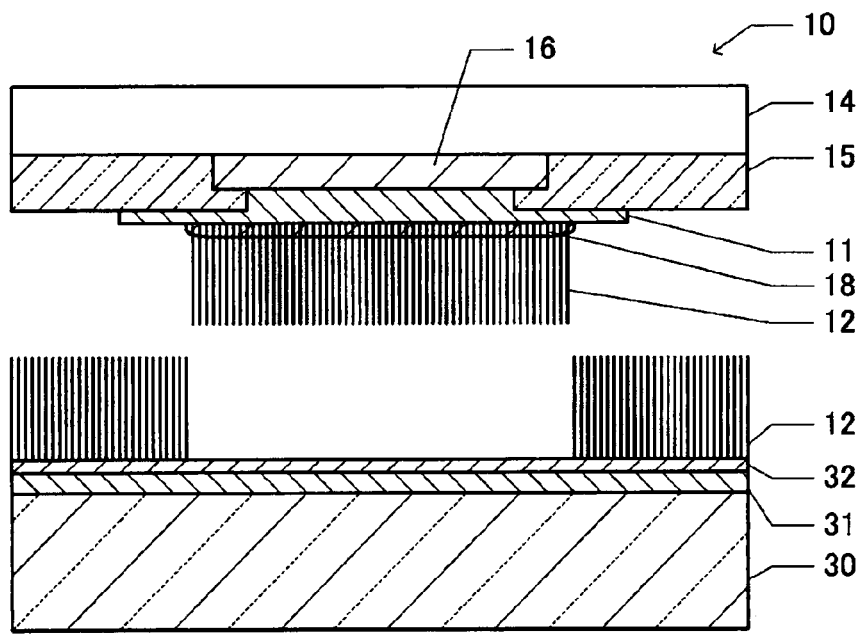

As shown in FIG. 6E, the substrate 30 is separated from the semiconductor chip 10. The carbon nanotubes 12 whose tips are inserted into the conductive paste 18 are left on the semiconductor chip 10. In this manner, the carbon nanotubes 12 formed on the substrate 30 can be partially transferred to the surface of the conductive pad 11 of the semiconductor chip 10 and fixed to the conductive pad 11.

In the example shown in FIGS. 6A to 6E, although the carbon nanotubes 12 are fixed to the conductive pad 11 of the semiconductor chip 10 by sintering the conductive paste 18, they may be fixed by other methods. For example, the conductive pad 11 may be made of metal having a low melting point, and the metal is heated in the state that the tips of the carbon nanotubes 12 are enforced to the conductive pad 11. With this method, it was actually possible to transfer the carbon nanotubes 12 growing on the substrate to an Au pattern and fix the carbon nanotubes to the Au pattern.

Figure 7A:
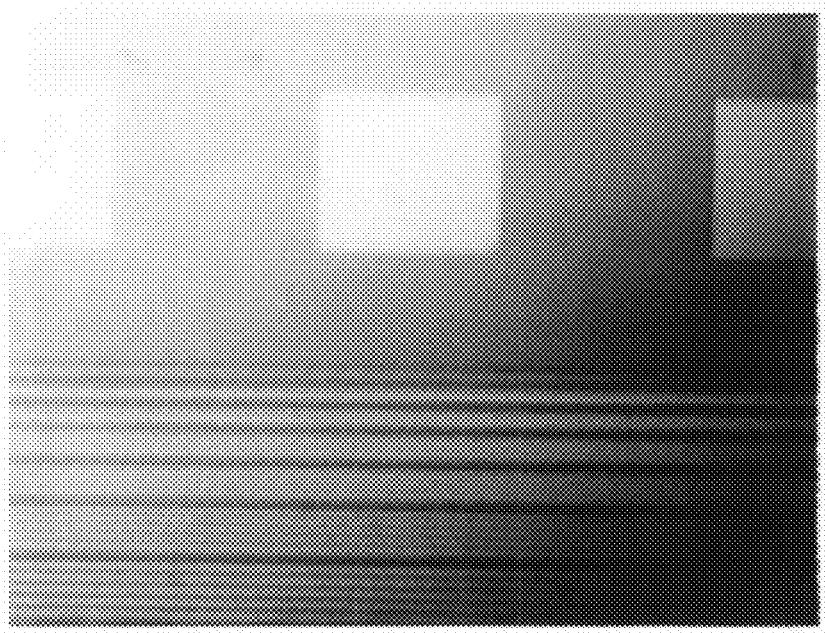
FIG. 7A is an SEM photograph showing conductive pads before carbon nanotubes are formed.
Figure 7B:
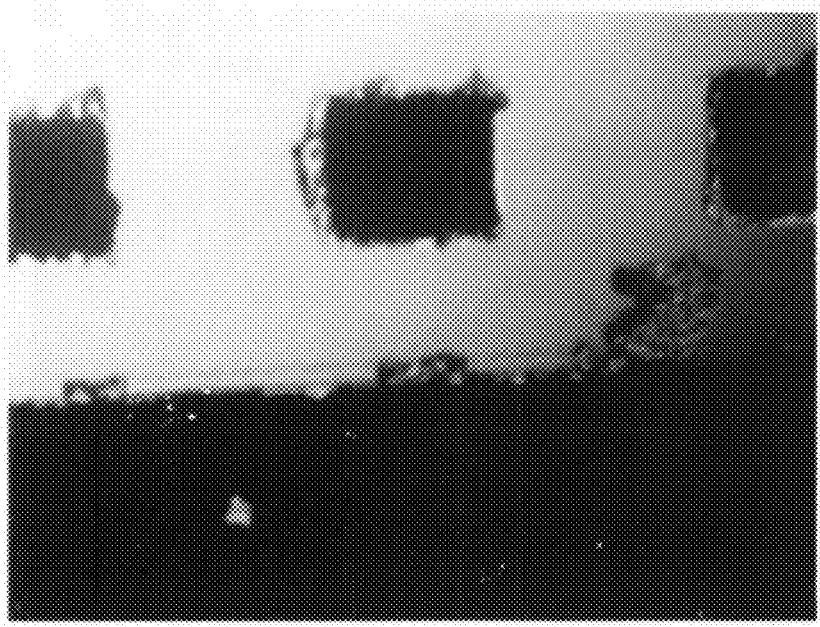
FIG. 7B is an SEM photograph showing conductive pad portions after carbon nanotubes are transferred.

FIG. 7A shows an SEM photograph of a rectangular pattern made of Au. A longer side of the rectangular pattern is 100 μm and a shorter side is 90 μm. FIG. 7B shows an SEM photograph after carbon nanotubes are transferred. It can be seen that carbon nanotubes are transferred and fixed to only the region where the Au pattern is formed.

Next, a semiconductor device of the fourth embodiment will be described with reference to FIGS. 8A and 8B.

Figure 8A:
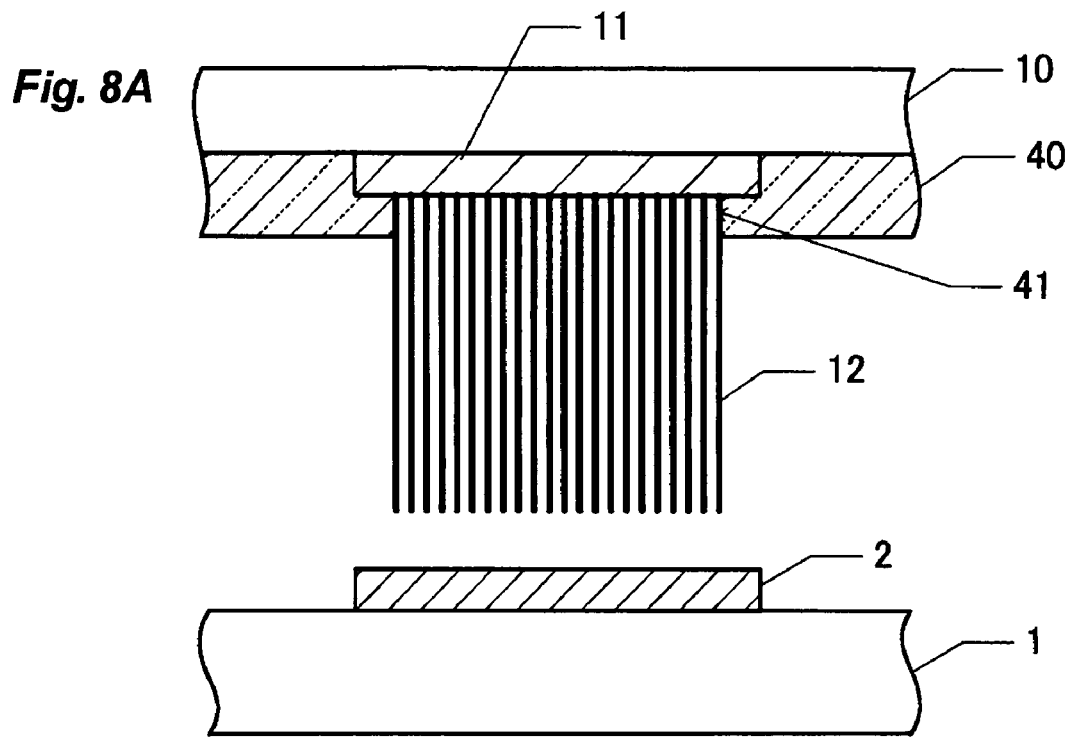
FIGS. 8A and 8B are schematic diagrams showing a connection portion between a mounting board and a semiconductor chip of a semiconductor device of a fourth embodiment.

FIG. 8A is a cross sectional view showing a main portion of a semiconductor chip 10. A conductive pad 11 is formed on the surface of the semiconductor chip 10. An insulating film 40 is also formed covering the semiconductor chip 10 and conductive pad 11. An opening is formed through the insulating film 40 to expose a partial surface of the conductive pad 11. An inner side face of the opening and the surface of the exposed conductive pad 11 define a recess 41. The surface of the conductive pad 11 exposed on the bottom of the recess 41 is made of metal functioning as catalyst for growing carbon nanotubes.

Carbon nanotubes 12 grow from the surface of the conductive pad 11 exposed on the bottom of the recess 41. The carbon nanotubes 12 can grow by CVD using acetylene gas or the like. Carbon nanotubes do not grow on the upper surface of the insulating film 40, because material functioning as catalyst does not exist on the upper surface of the insulating film 40. The carbon nanotubes 12 can therefore be obtained growing only from the bottom of the recess 41.

Figure 8B:
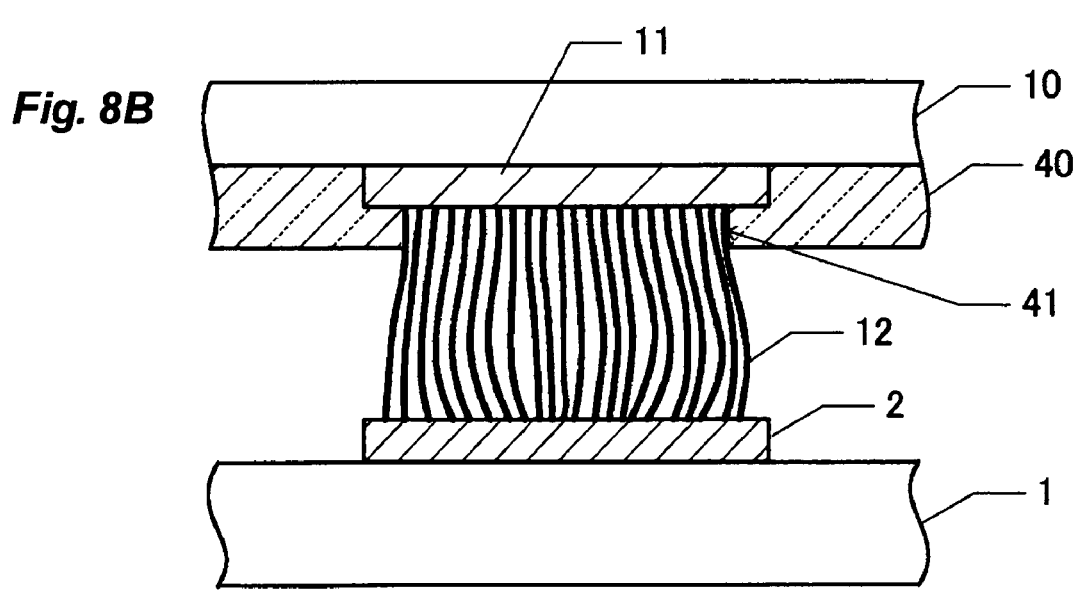

FIG. 8B is a schematic diagram showing the configuration of the carbon nanotubes 12 in the state that the semiconductor chip 10 shown in FIG. 8A is mounted on a mounting board 1. As the semiconductor chip 10 is pressed against the mounting board 1, the carbon nanotubes 12 deform and expand outward from the outer periphery of the conductive pad 11. In the fourth embodiment, since the roots of the carbon nanotubes on the semiconductor chip 10 are accommodated in the recess 41, an extension degree of the carbon nanotubes is limited by the sidewall of the recess 41. Since carbon nanotubes 12 growing from adjacent conductive pads 11 become difficult to be contacted, conductive pads 11 can be disposed more densely. Further, a mechanical strength and stability of the carbon nanotubes 12 can be increased.

In order to obtain the above-described effects, a depth of the recess is preferably set to 2 μm or deeper. The depth is preferably set to be equal to or deeper than one tenth of a length of the conductive nanotube 12.

In the first to fourth embodiments, although the conductive nanotubes 12 are fixed to the conductive pad 11 on the semiconductor chip 10, the conductive nanotubes 12 may be fixed to the conductive pad 2 on the mounting board 1.

Next, a semiconductor device of the fifth embodiment will be described with reference to FIGS. 9A and 9B.

Figure 9A:
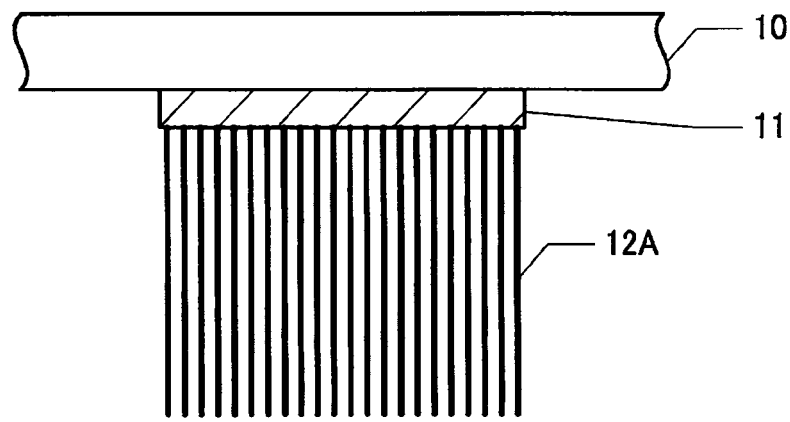
FIGS. 9A and 9B are schematic diagrams showing a connection portion between a mounting board and a semiconductor chip of a semiconductor device of a fifth embodiment.

As shown in FIG. 9A, conductive nanotubes 12A are fixed to a conductive pad 11 on the semiconductor chip 10, and conductive nanotubes 12B are also fixed to a conductive pad 2 on the mounting board 1.

Figure 9B:
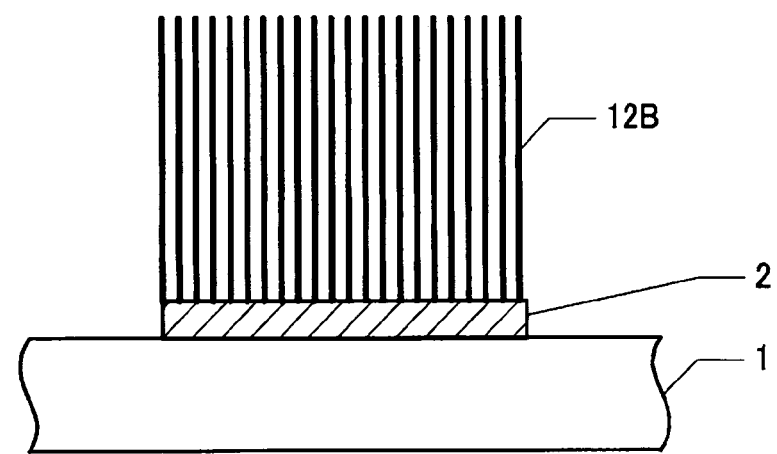
Figure 9B:
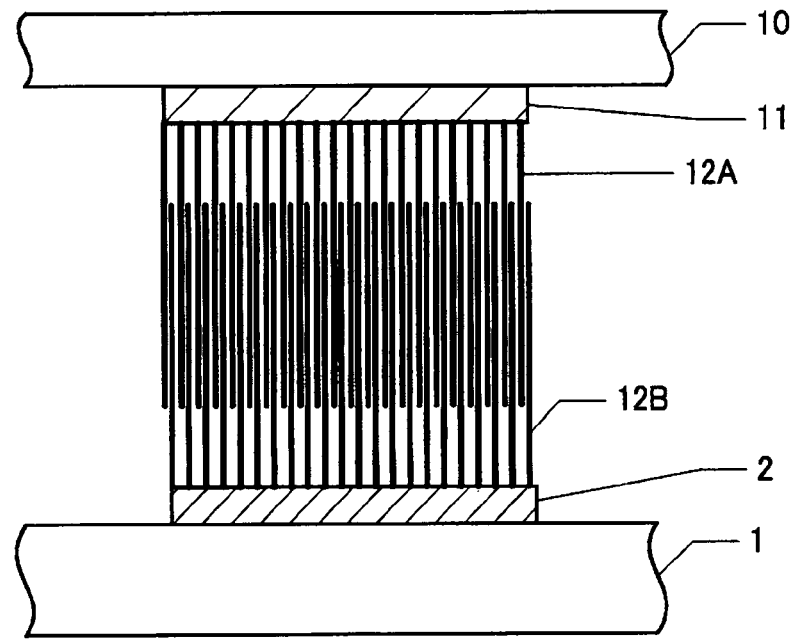

As shown in FIG. 9B, the semiconductor chip 10 and mounting board 1 are moved near to each other, with the conductive pads 2 and 11 being set facing each other. The conductive nanotubes 12A and 12B enter partner spaces and become in contact with one another at sidewalls of the conductive nanotubes. A friction force at the sidewalls of the conductive nanotubes 12A and 12B binds the semiconductor chip 10 to the mounting board 1. The semiconductor chip 10 can therefore be mounted on the mounting board 1 without using a special mechanism for fixing the position of the semiconductor chip 10.

In the first to fourth embodiments, the tips of the conductive nanotubes 12 fixed to the conductive pad 11 on the semiconductor chip 10 are in contact with the conductive pad 2 on the mounting board 1 at approximately points. In the fifth embodiment, the conductive nanotubes 12A and 12B are in plane contact so that a contact area can be broadened and a contact resistance can be lowered.

Further, since the semiconductor chip 10 is not fixed with adhesive, solder or the like, if the semiconductor chip 10 is judged defective, the semiconductor chip can be dismounted from the mounting board 1 relatively easily.

Also in the semiconductor device of the fifth embodiment, conductive nanotubes growing from the bottom of a recess may be used as shown in FIGS. 8A and 8B.

The present invention has been described in connection with the preferred embodiments. The invention is not limited only to the above embodiments. It will be apparent to those skilled in the art that other various modifications, improvements, combinations, and the like can be made.

What we claim are:

1. A semiconductor device comprising:
   a mounting board having conductive pads on a mounting surface;
   at least one semiconductor chip having conductive pads formed at positions corresponding to the conductive pads on the mounting board, when a principal surface of the semiconductor chip facing toward the mounting board;
   conductive nanotubes extending from each of the conductive pads of one of the mounting board and the semiconductor chip; and
   a press mechanism for pressing the semiconductor chip against the mounting board so as to curve the conductive nanotubes, to mount the semiconductor chip on the mounting board by restricting a position of the semiconductor chip in the mounting surface, in a state that tips of the conductive nanotubes are in contact with the conductive pads not formed with the conductive nanotubes,
   wherein surfaces of the conductive pads formed with the conductive nanotubes among the conductive pads of the mounting board and the conductive pads of the semiconductor chip define a bottom of a recess, and roots of the conductive nanotubes are fixed to the bottom of the recess.

2. The semiconductor device according to claim 1, wherein the press mechanism detachably mounts the semiconductor chip on the mounting board.

3. The semiconductor device according to claim 1, wherein the conductive nanotubes have a recovering force which makes the tips of the conductive nanotubes be enforced to the conductive pads not formed with the conductive nanotubes.

4. The semiconductor device according to claim 1, wherein the conductive nanotubes are carbon nanotubes.

5. A semiconductor device comprising:
   a mounting board having conductive pads on a mounting surface;
   at least one semiconductor chip having conductive pads formed at positions corresponding to the conductive pads of the mounting board, when a principal surface of the semiconductor chip faces toward the mounting board;
   conductive nanotubes extending from each of the conductive pads of one of the mounting board and the semiconductor chip; and
   adhesive made of resin softer than any of the mounting board and the semiconductor chip, the adhesive being impregnated at least in a partial space between the mounting board and the semiconductor chip and holding the semiconductor chip above the mounting board, in a state that tips of the conductive nanotubes are in contact with the conductive pads not formed with the conductive nanotubes,
   wherein surfaces of the conductive pads formed with the conductive nanotubes among the conductive pads of the mounting board and the conductive pads of the semiconductor chip define a bottom of a recess, and roots of the conductive nanotubes are fixed to the bottom of the recess.

6. The semiconductor device according to claim 5, wherein the conductive nanotubes are curved and have a recovering force which makes the tips of the conductive nanotubes be enforced to the conductive pads not formed with the conductive nanotubes.

7. The semiconductor device according to claim 5, wherein the conductive nanotubes are carbon nanotubes.

8. A semiconductor device comprising:
   a mounting board having a plurality of conductive pads on a mounting surface;
   a semiconductor chip having conductive pads formed at positions corresponding to the conductive pads of the mounting board, when a principal surface of the semiconductor chip faces toward the mounting board; and
   a plurality of conductive nanotubes extending from the conductive pads on both of the mounting board and the semiconductor chip,
   wherein the semiconductor chip is mounted on the mounting board such that sidewalls of the plurality of conductive nanotubes extending from the conductive pads of the mounting board are in contact with sidewalls of the plurality of conductive nanotubes extending from the conductive pads of the semiconductor chip.

9. The semiconductor device according to claim 8, wherein surfaces of the conductive pads of the mounting board and surfaces of the conductive pads of the semiconductor chip define bottoms of recesses, and roots of the conductive nanotubes are fixed to the bottoms of the recesses.

10. The semiconductor device according to claim 8, wherein the conductive nanotubes are carbon nanotubes.

* * * * *